United States Patent
Lim et al.

(10) Patent No.: US 9,685,801 B2
(45) Date of Patent: Jun. 20, 2017

(54) CIRCUIT BOARD FOR SECONDARY BATTERY HAVING CURRENT INTERRUPTER AND BATTERY PACK INCLUDING THE SAME

(71) Applicant: LG CHEM, LTD., Seoul (KR)

(72) Inventors: Jong-Min Lim, Daejeon (KR); Jin-Seob Kim, Daejeon (KR); Hyuck-Jun Ko, Daejeon (KR); Hyeong-Kwan Kang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 139 days.

(21) Appl. No.: 14/429,615

(22) PCT Filed: Apr. 30, 2014

(86) PCT No.: PCT/KR2014/003871
§ 371 (c)(1),
(2) Date: Mar. 19, 2015

(87) PCT Pub. No.: WO2015/167046
PCT Pub. Date: Nov. 5, 2015

(65) Prior Publication Data
US 2016/0218533 A1 Jul. 28, 2016

(51) Int. Cl.
*H02J 7/00* (2006.01)
*H01M 2/34* (2006.01)
(Continued)

(52) U.S. Cl.
CPC ......... *H02J 7/0042* (2013.01); *H01M 2/1077* (2013.01); *H01M 2/348* (2013.01);
(Continued)

(58) Field of Classification Search
CPC .................................................. H02J 7/0042
(Continued)

(56) References Cited

U.S. PATENT DOCUMENTS

| | | | |
|---|---|---|---|
| 6,524,732 B1* | 2/2003 | Iwaizono | H01M 10/42 429/100 |
| 8,039,145 B2* | 10/2011 | Ha | H01M 2/0212 429/163 |

(Continued)

FOREIGN PATENT DOCUMENTS

| | | |
|---|---|---|
| JP | 2002-8608 A | 1/2002 |
| JP | 2009-87920 A | 4/2009 |

(Continued)

*Primary Examiner* — Yalkew Fantu
(74) *Attorney, Agent, or Firm* — Birch, Stewart, Kolasch & Birch, LLP

(57) ABSTRACT

Disclosed is a circuit board for a secondary battery, which ensures an improved safety according to a temperature of the secondary battery, and a battery pack including the circuit board. The circuit board for a secondary battery, which is connected to at least one of a cathode tab and an anode tab of the secondary battery, includes a tab coupling portion connected to the cathode tab or the anode tab, a charging/discharging path connected to the tab coupling portion to give a path through which a charging current or a discharging current of the secondary battery flows, the charging/discharging path having at least one path cutting portion formed therein, one pair of conductive plates respectively attached to both ends of the path cutting portion, the conductive plates being at least partially bent, and a current interruption module having both ends respectively connected to the one pair of conductive plates, the current interruption module sensing a temperature of the secondary battery and interrupting a current according to the sensed temperature.

19 Claims, 4 Drawing Sheets

(51) Int. Cl.
*H01M 10/46* (2006.01)
*H01M 10/48* (2006.01)
*H05K 1/02* (2006.01)
*H01M 2/10* (2006.01)
*H01M 10/42* (2006.01)

(52) U.S. Cl.
CPC ......... *H01M 10/425* (2013.01); *H01M 10/46* (2013.01); *H01M 10/486* (2013.01); *H02J 7/0026* (2013.01); *H05K 1/0201* (2013.01); *H01M 2200/10* (2013.01); *H01M 2200/106* (2013.01); *H05K 2201/1034* (2013.01); *H05K 2201/10037* (2013.01); *H05K 2201/10151* (2013.01)

(58) Field of Classification Search
USPC ....................................................... 320/107
See application file for complete search history.

(56) References Cited

U.S. PATENT DOCUMENTS

| | | | |
|---|---|---|---|
| 8,178,236 B2* | 5/2012 | Kim | H01M 2/0404 429/175 |
| 8,237,409 B2 | 8/2012 | Jang | |
| 2003/0157399 A1 | 8/2003 | Ikeuchi et al. | |
| 2006/0093896 A1 | 5/2006 | Hong et al. | |
| 2006/0164812 A1 | 7/2006 | Ha et al. | |
| 2006/0170396 A1 | 8/2006 | Ha et al. | |
| 2006/0177733 A1 | 8/2006 | Ha et al. | |
| 2006/0275665 A1 | 12/2006 | Hyung et al. | |
| 2007/0037048 A1* | 2/2007 | Takeshita | H01M 2/0404 429/99 |
| 2008/0008910 A1 | 1/2008 | Koh | |
| 2008/0094032 A1* | 4/2008 | Miyamoto | H02J 7/0031 320/134 |
| 2008/0292955 A1* | 11/2008 | Byun | H01M 2/0207 429/163 |
| 2011/0091748 A1 | 4/2011 | Hyung et al. | |
| 2011/0123838 A1 | 5/2011 | Lee et al. | |
| 2012/0009443 A1 | 1/2012 | Baek et al. | |
| 2012/0106015 A1 | 5/2012 | Kwak et al. | |

FOREIGN PATENT DOCUMENTS

| | | |
|---|---|---|
| KR | 10-2006-0037841 A | 5/2006 |
| KR | 10-2008-0032912 A | 4/2008 |
| KR | 10-2012-0005930 A | 1/2012 |
| KR | 10-1296937 B1 | 8/2013 |
| TW | 531912 B | 5/2003 |
| TW | I286851 B | 9/2007 |
| TW | I298557 B | 7/2008 |
| TW | I299592 B | 8/2008 |
| WO | WO 01/99210 A1 | 12/2001 |

* cited by examiner

CIRCUIT BOARD FOR SECONDARY BATTERY HAVING CURRENT INTERRUPTER AND BATTERY PACK INCLUDING THE SAME

TECHNICAL FIELD

The present disclosure relates to a circuit board for a secondary battery, and more particularly, to a circuit board for a secondary battery having a current interruption module for restricting a charging/discharging current according to a temperature of a secondary battery and allowing the current interruption module to perform its function more precisely, and a battery pack including the circuit board.

BACKGROUND ART

Recently, with the active development of electric vehicles, storage batteries, robots, satellites, and the like, along with the dramatically increasing demand for portable electronic products such as laptop computers, video cameras, mobile phones, and the like, research and development for high-performance secondary batteries capable of repeatedly charging and discharging has been actively made.

Currently, nickel-cadmium batteries, nickel-metal hydride batteries, nickel-zinc batteries, lithium secondary batteries, and the like are used as commercial secondary batteries. Among them, lithium secondary batteries have little to no memory effect in comparison with nickel-based secondary batteries, and thus lithium secondary batteries are gaining a lot of attention for their advantages of free charging or discharging, low self-discharging, and high energy density.

A lithium secondary battery generally uses lithium oxide and carbonaceous material as a cathode active material and anode active material, respectively. The lithium secondary battery includes an electrode assembly in which a cathode plate and an anode plate respectively coated with the cathode active material and the anode active material are disposed with a separator being interposed between them, and an exterior, namely a battery case, which seals and accommodates the electrode assembly together with an electrolyte.

Generally, a lithium secondary battery may be classified into a can type secondary battery where the electrode assembly is included in a metal can and a pouch type battery where the electrode assembly is included in a pouch of an aluminum laminate sheet, depending on the shape of the exterior.

Generally, the performance of a secondary battery may deteriorate due to a temperature, and if a temperature rises, a secondary battery may be heated or exploded. Further, since the secondary battery includes various combustible substances therein, the heating or explosion of the secondary battery may cause another external component to be fired or exploded, which may result in damage of property or human life. In addition, if a temperature of a secondary battery rises to deform a shape of a component such as a separator, the secondary battery may be fired or exploded due to an internal short circuit of a cathode and an anode.

In this circumstance, in order to ensure safety according to a temperature of a secondary battery, a current interruption module for restricting a current according to a temperature of the secondary battery, for example a temperature cut-out (TCO) or a positive temperature coefficient (PTC), is generally used.

FIG. 1 is a schematic view showing a general battery pack in which a pouch-type secondary battery 10 is connected to a current interruption module, and FIG. 2 is a schematic view showing that a protection circuit module 30 is connected to the battery pack of FIG. 1.

In most cases, a secondary battery 10, particularly a pouch-type secondary battery 10, does not include a current interruption module 20 such as a TCO, which responds to a temperature. Therefore, the current interruption module 20 such as a TCO is generally connected to an outside of the pouch-type secondary battery 10.

In addition, the general pouch-type secondary battery 10 is connected to a protection circuit module (PCM) 30 which controls charging or discharging to prevent the secondary battery 10 from being overcharged or overdischarged. However, in this case, the pouch-type secondary battery 10 and the protection circuit module 30 are not directly connected, but the current interruption module 20 such as a TCO is generally interposed between them.

For this, in an existing technique, as shown in FIG. 1, an electrode tab 11, for example a cathode tab, of the pouch-type secondary battery 10 is firstly welded to one end of the current interruption module 20. In addition, the cathode tab welded to the current interruption module 20 as described above is bent toward the pouch-type secondary battery 10, as indicated by the arrow a in FIG. 2, and placed on a terrace T of the secondary battery 10. By doing so, the current interruption module 20 is located closest to the secondary battery 10, which allows the temperature of the secondary battery 10 to be sensed more accurately and thus the resultant current interruption ability to be enhanced.

After that, the other end of the current interruption module 20 is connected to a contact portion 31 formed at the protection circuit module 30. At this time, various components for controlling charging or discharging of the secondary battery 10 may be mounted to the protection circuit module 30, and an external connection terminal 32 connected to an external component to input or output a charging/discharging current of the secondary battery 10 may be provided.

However, in the above configuration, the current interruption module 20 should be independently attached to each of a plurality of secondary batteries 10, which results in complicated production processes and increase of costs. In particular, this problem may be worse in a middle- or large-sized battery pack including many secondary batteries 10 in a single battery pack.

In addition, in a general battery pack configured as above, after the electrode tab 11 and the current interruption module 20 are welded, the current interruption module 20 may damage a pouch of the secondary battery 10 while the electrode tab 11 is bent and the current interruption module 20 is placed on the terrace T of the secondary battery 10. Moreover, in an existing battery pack, to ensure insulation against the current interruption module 20, an insulation tape is frequently attached to the terrace T of the secondary battery 10, which however may increase production time and costs.

DISCLOSURE

Technical Problem

The present disclosure is designed to solve the problems of the related art, and therefore the present disclosure is directed to providing a circuit board for a secondary battery capable of improving the process efficiency and ensuring the enhanced safety according to temperature of the secondary battery, and a battery pack including the circuit board.

Other objects and advantages of the present disclosure will be understood from the following descriptions and become apparent by the embodiments of the present disclosure. In addition, it is understood that the objects and advantages of the present disclosure may be implemented by components defined in the appended claims or their combinations.

Technical Solution

In one aspect of the present disclosure, there is provided a circuit board for a secondary battery, which is connected to at least one of a cathode tab and an anode tab of the secondary battery, the circuit board including a tab coupling portion connected to the cathode tab or the anode tab; a charging/discharging path connected to the tab coupling portion to give a path through which a charging current or a discharging current of the secondary battery flows, the charging/discharging path having at least one path cutting portion formed therein; one pair of conductive plates respectively attached to both ends of the path cutting portion, the conductive plates being at least partially bent; and a current interruption module having both ends respectively connected to the one pair of conductive plates, the current interruption module sensing a temperature of the secondary battery and interrupting a current according to the sensed temperature.

Preferably, the circuit board for a secondary battery according to the present disclosure may further include a protection circuit module provided on the charging/discharging path to control charging or discharging of the secondary battery.

Also preferably, the circuit board for a secondary battery according to the present disclosure may further include a protection circuit module connected to an external connection terminal to control charging or discharging of the secondary battery.

Also preferably, the conductive plate may have an adjustable bending angle.

Also preferably, the conductive plate may be perpendicularly bent.

Also preferably, the conductive plate may be bent in a state of protruding toward a location where the secondary battery is positioned.

Also preferably, the conductive plate may be bent on at least two portions.

Also preferably, the conductive plate may be bent so that at least a part of the current interruption module contacts the secondary battery.

Also preferably, the conductive plate may be made of a metal material.

Also preferably, the current interruption module may interrupt a current when the temperature of the secondary battery rises over a reference temperature.

Also preferably, the current interruption module may be a temperature cut-off (TCO) or a positive temperature coefficient (PTC).

Also preferably, the tab coupling portion may come into contact with the cathode tab or the anode tab by means of welding.

Also preferably, the tab coupling portion may be provided in plural to be coupled to a plurality of cathode tabs or a plurality of anode tabs.

Also preferably, the secondary battery may be a pouch-type secondary battery.

In another aspect of the present disclosure, there is also provided a battery pack which includes the circuit board for a secondary battery, described above.

Advantageous Effects

In an aspect of the present disclosure, it is not necessary to perform a process of connecting a current interruption module such as a TCO or PTC for interrupting a current according to a temperature to an electrode tab of a secondary battery and a process of connecting the current interruption module to a protection circuit module, before connecting the secondary battery to the protection circuit module.

Therefore, in the present disclosure, it is possible to shorten the production time of a battery pack and reduce production costs, which results in improvement of productivity and yield.

In particular, due to the above feature of the present disclosure, if a plurality of secondary batteries is included in a battery pack, it is not necessary to weld a current interruption module to an electrode tab of each secondary battery, which may greatly improve the production property.

In addition, in another aspect of the present disclosure, it is not necessary to perform a process of bending an electrode tab and placing a current interruption module on a terrace of the pouch-type secondary battery, thereby preventing the secondary battery from being damaged during the process. Moreover, since this process may not be performed, the process efficiency may also be improved.

Moreover, in another aspect of the present disclosure, since a current interruption module is not placed on the terrace of the pouch-type secondary battery, the terrace may not have an insulation tape. Therefore, the process efficiency is improved, which may reduce production time and costs.

In addition, in another aspect of the present disclosure, the current interruption module may protrude from a circuit board body and thus be located closer to the pouch-type secondary battery. Therefore, the current interruption module may measure a temperature of the secondary battery more accurately, which may ensure stable current interruption ability according to the measured temperature. For this reason, the safety of the secondary battery may be improved.

In particular, in another aspect of the present disclosure, since a distance between the circuit board body and the current interruption module may be adjusted, the circuit board according to the present disclosure may be easily applied to various secondary batteries having different shapes.

DESCRIPTION OF DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 3:
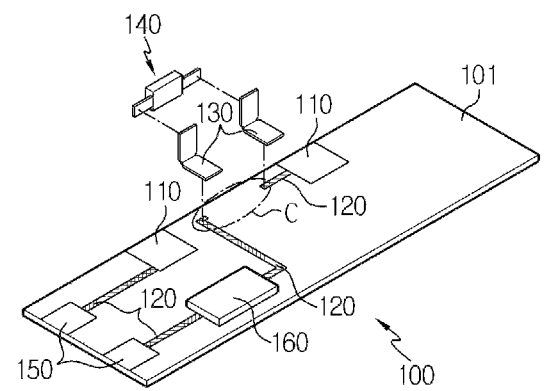
FIG. 3 is an exploded perspective view schematically showing a circuit board for a secondary battery according to an embodiment of the present disclosure.
Figure 4:
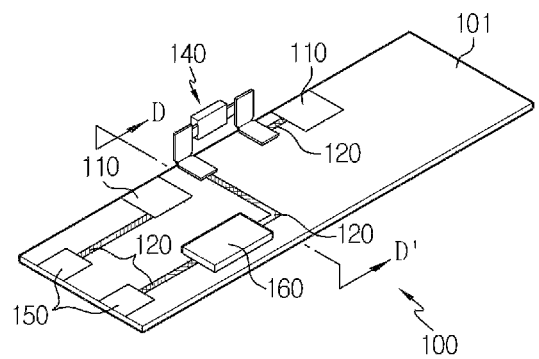
FIG. 4 is a diagram showing an assembled state of the circuit board depicted in FIG. 3.

FIG. 3 is an exploded perspective view schematically showing a circuit board 100 for a secondary battery according to an embodiment of the present disclosure, and FIG. 4 shows an assembled state of FIG. 3.

Referring to FIGS. 3 and 4, the circuit board 100 for a secondary battery according to the present disclosure includes a tab coupling portion 110, a charging/discharging path 120, a conductive plate 130 and a current interruption module 140.

Here, the circuit board 100 may further include a body 101 made of an insulation material, in addition to the tab coupling portion 110, the charging/discharging path 120, the conductive plate 130 and the current interruption module 140. For example, the circuit board body 101 may be made of an insulation material such as plastic, and the circuit board 100 may have an approximately rectangular plate shape as a whole. However, the present disclosure is not limited to such a detailed shape of the circuit board 100, and the circuit board 100 according to the present disclosure may have various shapes depending on a structure of an applied secondary battery or battery pack.

Preferably, the circuit board 100 for a secondary battery according to the present disclosure may be a printed circuit board (PCB). The printed circuit board may be formed to have a circuit pattern by covering a thin copper foil on a plate made of an insulation material and then detaching unnecessary copper foil portions according to a circuit design.

The tab coupling portion 110 is made of an electrically conductive material like metal and is coupled to an electrode tab of a secondary battery. Therefore, the tab coupling portion 110 may serve as an inlet through which a discharging current of the secondary battery flows in from the secondary battery to the circuit board 100 and an outlet through which a charging current of the secondary battery flows out from the circuit board 100 to the secondary battery.

At this time, there may be provided one pair of tab coupling portions 110, as shown in the figures. In this case, one tab coupling portion 110 may be coupled to a cathode tab, and the other tab coupling portion 110 may be coupled to an anode tab. However, the present disclosure is not limited thereto, and there may be provided only a single tab coupling portion 110 which is coupled only to the cathode tab or the anode tab.

Preferably, the tab coupling portion 110 may be coupled to directly contact the electrode tab. In this case, the electrode tab and the tab coupling portion 110 may be coupled and fixed by means of welding. In other words, the tab coupling portion 110 may direct contacts the cathode tab or the anode tab of the secondary battery by means of welding. However, another connection member or the like may also be included between the electrode tab of the secondary battery and the tab coupling portion 110.

The charging/discharging path 120 is connected to the tab coupling portion 110 to give a current flow path through which a charging current or a discharging current of the secondary battery flows. In other words, the discharging current supplied by the secondary battery may flow to the circuit board 100 by means of the tab coupling portion 110, flow along the charging/discharging path 120 in the circuit board 100, and be supplied to a load connected to the circuit board 100. In addition, the discharging current supplied to the secondary battery may flow from an external charging device to the circuit board 100, flow along the charging/discharging path 120 in the circuit board 100, and be supplied to the secondary battery by means of the tab coupling portion 110.

When the circuit board 100 is configured as a printed circuit board, the charging/discharging path 120 may be formed to have a circuit pattern of a copper foil. In addition, the charging/discharging path 120 may be formed to be exposed on the substrate or not to be exposed on the circuit board 100.

In particular, the charging/discharging path 120 according to the present disclosure may include at least one path cutting portion, namely a portion where a current flow path is cut, as indicated by C in FIG. 3. However, even though FIG. 3 shows that the path cutting portion is formed in only a single charging/discharging path 120 connected to a single tab coupling portion 110, the path cutting portion may also be formed in two charging/discharging paths 120 connected to both tab coupling portions 110. In addition, two or more path cutting portions may also be formed in a single charging/discharging path 120.

The conductive plate 130 may be configured as a thin plate having an electrically conductive material. For example, the conductive plate 130 may be made of a metal material with good electrically conductivity, for example copper and aluminum. In addition, at least one pair of such conductive plates 130, namely two conductive plates 130, may be included in the circuit board 100. Moreover, the conductive plates 130 are respectively attached to both ends of the path cutting portion. In other words, as shown in FIGS. 3 and 4, if a single path cutting portion is formed in the charging/discharging path 120, a single conductive plate 130 may be attached to one end of the path cutting portion, and the other conductive plate 130 may be attached to the other end of the path cutting portion.

In particular, the conductive plate 130 is configured to be bent at least partially. This will be described in more detail below with reference to FIG. 5.

Figure 5:
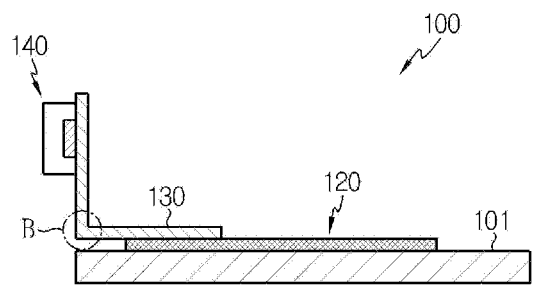
FIG. 5 is a cross-sectional view, taken along the line D-D' of FIG. 4.

FIG. 5 is a cross-sectional view, taken along the line D-D' of FIG. 4.

Referring to FIG. 5, the conductive plate 130 is attached onto the charging/discharging path 120 and has a bent portion as indicated by B in any portion. Since the conductive plate 130 is at least partially bent as described above, the conductive plate 130 may erect at a predetermined angle based on the circuit board body 101 where the charging/discharging path 120 is formed.

Both ends of the current interruption module 140 are respectively connected to one pair of conductive plates 130. In other words, the current interruption module 140 may have two conductive ends, which are attached to different conductive plates 130. In particular, the current interruption module 140 may be attached to an end opposite to an end to which the charging/discharging path 120 is connected, based on the bent portion of the conductive plate 130. Therefore, one end of the conductive plate 130 may be connected to the charging/discharging path 120, and the other end may be connected to the current interruption module 140, based on the bent portion.

Since the current interruption module 140 is interposed between two conductive plates 130 spaced apart from each other by a predetermined distance to ensure a current flow, in an abnormal state, the path cutting portion of the charging/discharging path 120 may be electrically connected by means of the current interruption module 140. Therefore, the charging/discharging current may flow via the charging/discharging path 120, the conductive plate 130 and the current interruption module 140.

As described above, the current interruption module 140 may give a path through which the charging/discharging current may flow and also interrupt a current according to a surrounding temperature. In particular, the current interruption module 140 according to the present disclosure may be installed near a secondary battery to measure a temperature of the secondary battery and interrupt a current according to the sensed temperature.

Preferably, the current interruption module 140 may interrupt a current when the temperature of the secondary battery rises over a reference temperature. If the temperature of the secondary battery rises, the performance of the secondary battery may deteriorate or the secondary battery may be damaged, which may result in firing or explosion of the secondary battery and cause damage in property or human life. However, in this embodiment, the current interruption module 140 may interrupt the charging/discharging current of the secondary battery before the temperature of the secondary battery rises up to a temperature capable of damaging, firing or exploding the secondary battery. Therefore, it is possible to protect not only the secondary battery but also a user using the secondary battery or other devices to which the secondary battery is applied.

More preferably, the current interruption module 140 may be implemented as a temperature control element such as a TCO or a PTC. However, the current interruption module 140 of the present disclosure is not limited thereto but may employ various kinds of elements.

In particular, both ends of the current interruption module 140 according to the present disclosure are attached to the conductive plate 130. At this time, the conductive plate 130 is partially bent, and based on the bent portion, its one end is attached to the charging/discharging path 120 and the other end erects from the circuit board body 101. In addition, the current interruption module 140 is connected to the other end of the conductive plate 130 which erects from the circuit board body 101 as described above. Therefore, the current interruption module 140 is connected to the charging/discharging path 120 of the circuit board 100 through the conductive plate 130 and mounted to the circuit board 100, but to be spaced apart from the circuit board body 101 by a predetermined distance. In addition, due to this configuration, the current interruption module 140 may be configured to be close to an exterior of the secondary battery, for example an aluminum pouch of the pouch-type secondary battery.

Figure 6:
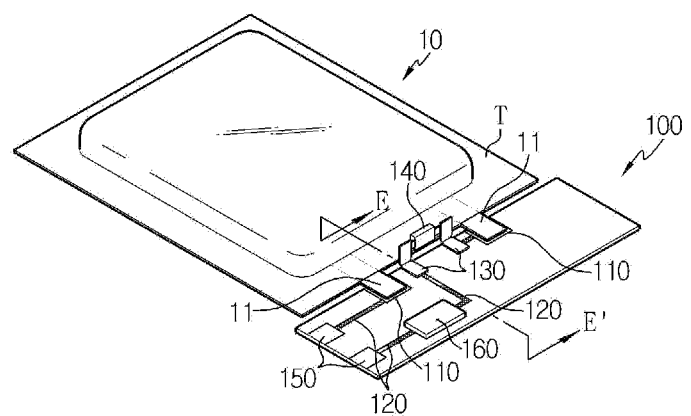
FIG. 6 is a schematic view showing that the circuit board for a secondary battery depicted in FIG. 4 is connected to an electrode tab of the pouch-type secondary battery.
Figure 7:
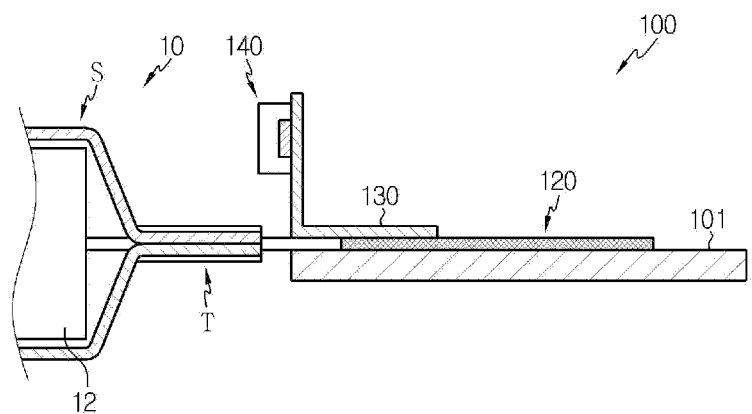
FIG. 7 is a cross-sectional view, taken along the line E-E' of FIG. 6.

FIG. 6 is a schematic view showing that the circuit board 100 for a secondary battery depicted in FIG. 4 is connected to an electrode tab 11 of the pouch-type secondary battery 10, and FIG. 7 is a cross-sectional view, taken along the line E-E' of FIG. 6.

Referring to FIGS. 6 and 7, the circuit board 100 for a secondary battery according to the present disclosure may be connected to at least one of the cathode tab and the anode tab of the secondary battery 10 through the tab coupling portion 110. In addition, the circuit board 100 for a secondary battery may provide an external connection terminal 150 so that the charging/discharging circuit is connected thereto. Therefore, if a discharge device such as a load is connected to the external connection terminal 150, a discharging current supplied from the secondary battery 10 is supplied to the discharge device through the circuit board 100. In addition, if a charging device such as a commercial power source is connected to the external connection terminal 150, the charging current supplied from the charging device is supplied to the secondary battery 10 through the circuit board 100.

In particular, the circuit board 100 for a secondary battery according to the present disclosure includes the current interruption module 140 on the charging/discharging path 120, so that the current interruption module 140 is not attached to the upper surface of the body 101 of the circuit board 100 but is connected to the circuit board 100 in a state of being spaced apart from the body 101 of the circuit board 100 by a predetermined distance. In other words, the current interruption module 140 is attached to a portion of the partially bent conductive plate 130, which erects at a predetermined angle from the upper surface of the body 101 of the circuit board 100, and thus the current interruption module 140 may be located closer to the secondary battery 10 in comparison to the upper surface of the body 101 of the circuit board 100.

Therefore, in this aspect of the present disclosure, since the current interruption module 140 is provided closer to the secondary battery 10 and senses a temperature change of the secondary battery 10 more accurately, the safety of the secondary battery 10 may be ensured more effectively. For example, if the temperature of the secondary battery 10 rises over a reference temperature, the current interruption module 140 may sense this temperature rise accurately and rapidly and interrupt the flow of a charging/discharging current of the secondary battery 10.

Further, the pouch-type secondary battery 10 has an accommodation space formed in the exterior as indicated by a reference symbol S, and the accommodation space accommodates the electrode assembly 12 and an electrolyte. Here, the temperature of the pouch-type secondary battery 10 may be more accurately measured when the pouch-type secondary battery 10 is closer to the accommodation space. It is because in an abnormal situation, the temperature generally rises in a space where the electrode assembly 12 and the electrolyte are accommodated. In the present disclosure, since the current interruption module 140 is spaced apart from the circuit board body 101 and located close to the accommodation space of the pouch exterior by means of the bent conductive plate 130, the temperature of the secondary battery 10 may be sensed more accurately and rapidly. Therefore, in this aspect of the present disclosure, the safety of the secondary battery 10 may be improved more effectively by means of the current interruption module 140.

Meanwhile, the circuit board 100 for a secondary battery according to the present disclosure may further include a protection circuit module (PCM) 160.

Here, the protection circuit module 160 is an element capable of generally controlling charging or discharging of the secondary battery 10 and preventing an overcharge or overdischarge by checking a voltage or current of the secondary battery 10. For this, the protection circuit module 160 may employ an integrated circuit or a switching element. This protection circuit module 160 may be called with various terms such as a battery management unit (BMU), a protection circuit or the like.

In particular, the circuit board 100 for a secondary battery according to the present disclosure may include the protection circuit module 160 on the charging/discharging path 120. In this case, the protection circuit module 160 may be located at an upper portion of the body 101 of the circuit board 100 for a secondary battery. In addition, at this time, since the circuit board 100 for a secondary battery may play a role of the protection circuit module 160 by itself, the circuit board 100 may also serve as the protection circuit module 160 or a protection circuit board. In this case, it may also be regarded that the current interruption module 140 such as a TCO or a PTC is mounted to the protection circuit module 160.

In addition, in the circuit board 100 for a secondary battery according to the present disclosure, the protection circuit module 160 may not be located on the circuit board body 101 but connected to the external connection terminal 150 provided at the circuit board 100. In this case, the circuit board 100 may be regarded as an element including the protection circuit module 160 or an element connecting the protection circuit module 160 and the secondary battery 10.

Preferably, the conductive plate 130 may be configured to have an adjustable bending angle.

Figure 8:
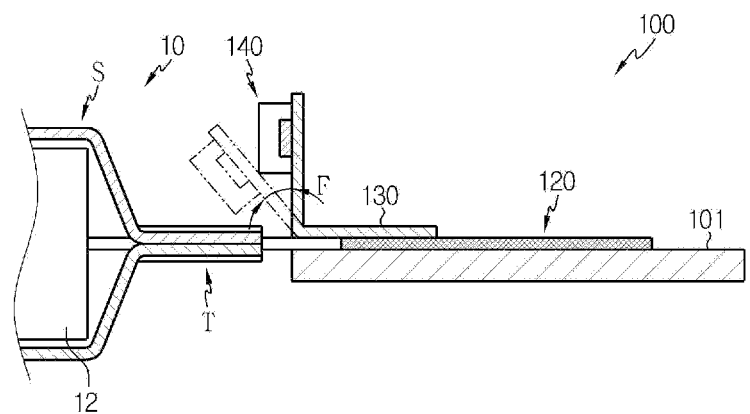
FIG. 8 is a cross-sectional view schematically showing a circuit board for a secondary battery according to another embodiment of the present disclosure.

FIG. 8 is a cross-sectional view schematically showing a circuit board 10 for a secondary battery according to another embodiment of the present disclosure.

Referring to FIG. 8, the conductive plate 130 included in the circuit board 100 is configured to have an adjustable bending angle, different from FIG. 7. In other words, as indicated by the arrow F in FIG. 8, the bent portion of the conductive plate 130 may be configured to have an adjustable angle.

In this embodiment, a distance between the accommodation portion S of the pouch-type secondary battery 10 and the current interruption module 140 may be adjusted by changing only the bending angle of the conductive plate 130, after the electrode tab 11 of the secondary battery 10 is attached to the tab coupling portion 110 of the circuit board 100. In particular, if the bending angle is adjusted so that the other end of the bent portion of the conductive plate 130 is close to the accommodation portion S of the secondary battery 10, even though the circuit board body 101 is fixed, the current interruption module 140 may be configured to be closer to the accommodation portion S of the secondary battery 10. Moreover, since the pouch-type secondary battery 10 may have various shapes, the distance between the pouch-type secondary battery 10 of the circuit board 100 and the accommodation portion S may be different depending on the shape of the pouch-type secondary battery 10. However, in this embodiment, even though the pouch-type secondary battery 10 has various shapes, the current interruption module 140 may be provided to be closest to the accommodation portion S of the secondary battery 10 by adjusting the bending angle of the conductive plate 130.

Also preferably, the conductive plate 130 may be provided to be bent in a state of protruding toward the secondary battery 10. This will be described later in more detail with reference to FIG. 9.

Figure 9:
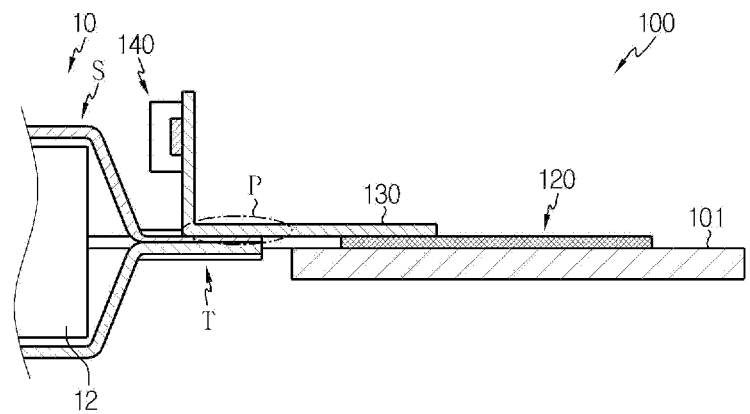
FIG. 9 is a cross-sectional view schematically showing that the circuit board for a secondary battery according to another embodiment of the present disclosure is connected to the pouch-type secondary battery.

FIG. 9 is a cross-sectional view schematically showing that the circuit board 100 for a secondary battery according to another embodiment of the present disclosure is connected to the pouch-type secondary battery 10.

Referring to FIG. 9, the conductive plate 130 may be configured to be bent in a state of horizontally protruding from the circuit board body 101, as indicated by P. In other words, the conductive plate 130 extends to protrude toward the secondary battery 10 in a horizontal direction in a state of being attached to the charging/discharging path 120, and a bent portion may be formed in the protruding portion.

In this embodiment, a distance between the current interruption module 140 and the accommodation portion S of the secondary battery 10 may decrease as much as a protruding portion toward the secondary battery 10. Therefore, the current interruption module 140 may sense a temperature of the secondary battery 10 more accurately.

Also preferably, the conductive plate 130 may be configured to have two or more bent portions.

Figure 10:
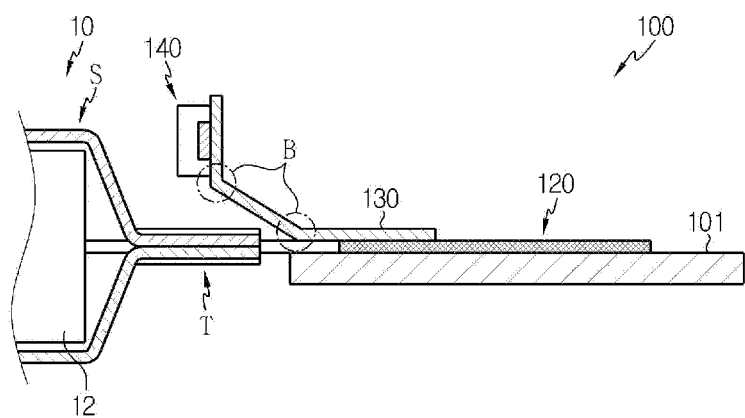
FIG. 10 is a cross-sectional view schematically showing that the circuit board for a secondary battery according to another embodiment of the present disclosure is connected to the pouch-type secondary battery.

FIG. 10 is a cross-sectional view schematically showing that the circuit board 100 for a secondary battery according to another embodiment of the present disclosure is connected to the pouch-type secondary battery 10.

Referring to FIG. 10, the conductive plate 130 may have two or more bent portions, as indicated by B. In this embodiment, the current interruption module 140 located at an end may be closer to the accommodation portion S of the pouch-type secondary battery 10. In this embodiment, if at least one of the plurality of bent portions is configured to have an adjustable bending angle, the location of the current interruption module 140 may be closer to the accommodation portion S of the secondary battery 10 and correspond to various shapes of the pouch-type secondary battery 10.

If the current interruption module 140 is configured to be closest to the secondary battery 10 as described above, a temperature of the secondary battery 10 may be sensed more accurately. Preferably, the current interruption module 140 may contact the secondary battery 10, more preferably a portion where the accommodation portion S of the secondary battery 10 is located. Therefore, the conductive plate 130 may have a bent shape so that the current interruption module 140 contacts an exterior at a portion where the accommodation portion S of the secondary battery 10 is located. However, in this case, the current interruption module 140 may be surrounded by an electrically insulating material, particularly at a portion contacting the exterior of the secondary battery 10.

Figure 1:
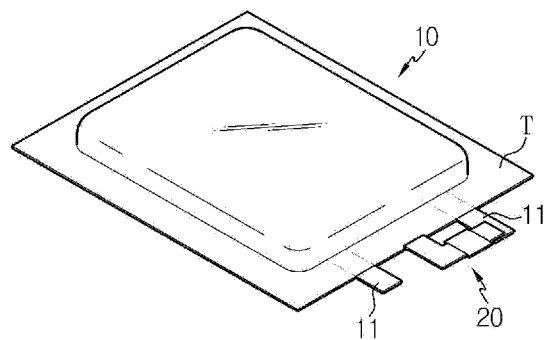
FIG. 1 is a schematic view showing a general battery pack in which a pouch-type secondary battery is connected to a current interruption module.
Figure 2:
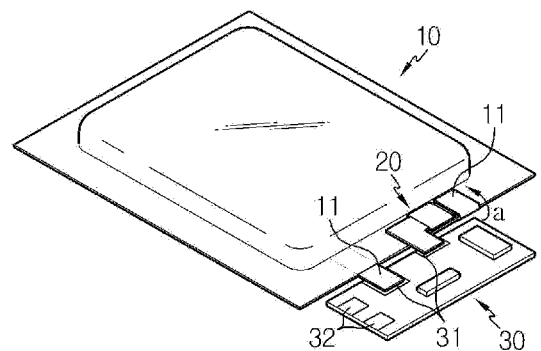
FIG. 2 is a schematic view showing that a protection circuit module is connected to the battery pack of FIG. 1.

In various embodiments of the present disclosure, the current interruption module 140 may be located close to the accommodation portion S of the secondary battery 10 as described above, and thus it is not necessary to place the circuit board body 101 on the terrace T of the pouch-type secondary battery 10, different from an existing technique as depicted in FIG. 2. Therefore, it is not necessary to interpose an insulation tape for electric insulation between the circuit board 100 and the pouch exterior, and it is possible to prevent some components of the circuit board 100 from damaging the pouch exterior of the secondary battery 10 during a process of placing the circuit board 100 on the terrace T. Moreover, since the current interruption module 140 may measure a temperature of the secondary battery 10 more accurately when being located closer to the accommodation portion S of the secondary battery 10 in comparison to a case where the current interruption module 140 is placed on the terrace T, in the present disclosure, it is possible to measure a temperature of the secondary battery 10 and interrupt a current accordingly in a more accurate and rapid way.

Meanwhile, even though it has been illustrated in the above embodiments that the circuit board 100 for a secondary battery according to the present disclosure is connected to a single secondary battery 10, the present disclosure is not limited thereto. In other words, the circuit board 100 for a secondary battery according to the present disclosure may be connected to a plurality of secondary batteries 10.

Figure 11:
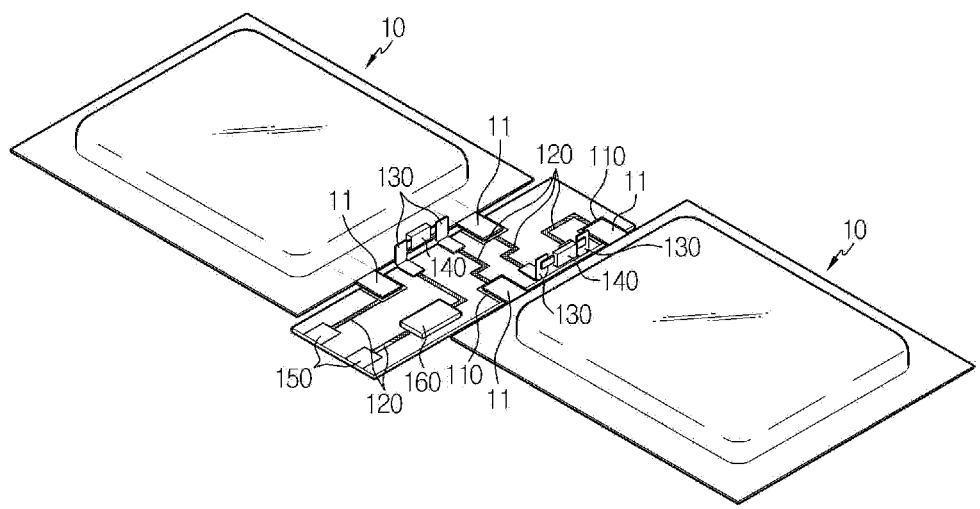
FIG. 11 is a schematic view showing that the circuit board for a secondary battery according to another embodiment of the present disclosure is connected to a plurality of secondary batteries.

FIG. 11 is a schematic view showing that the circuit board 100 for a secondary battery according to another embodiment of the present disclosure is connected to a plurality of secondary batteries 10.

Referring to FIG. 11, the circuit board 100 according to the present disclosure may include a plurality of tab coupling portions 110 for coupling a plurality of cathode tabs and/or a plurality of anode tabs. Therefore, cathode tabs and/or anode tabs of two or more secondary batteries 10 may be coupled to the plurality of tab coupling portions 110.

At this time, the charging/discharging path 120 may have various patterns in the circuit board 100 depending on whether the plurality of secondary batteries 10 is connected in series or in parallel.

Meanwhile, in this case, as shown in FIG. 11, a plurality of current interruption modules 140 may be provided to sense temperatures of the plurality of secondary batteries 10, and these current interruption modules 140 may be installed near each secondary battery 10 by means of many pairs of at least partially bent conductive plates 130.

If a plurality of secondary batteries 10 is connected to a single circuit board 100 as described above, since the current interruption module 140 such as a TCO is mounted to the circuit board 100, it is possible to sense temperatures of the plurality of secondary batteries 10 and perform a current interruption function just by attaching the electrode tabs 11 of the plurality of secondary batteries 10 to the circuit board 100. Therefore, it is not necessary to individually attach a current interruption module 140 to an electrode tab 11 of each secondary battery 10 before connecting the electrode tab 11 of each secondary battery 10 to the circuit board 100.

The circuit board 100 for a secondary battery according to the present disclosure may be applied to a pouch-type secondary battery. In most cases, the pouch-type secondary battery does not include a current interruption member such as a TCO or a PTC in a secondary battery, the current interruption member of the circuit board 100 for a secondary battery according to the present disclosure may be more suitably applied to the pouch-type secondary battery having the accommodation portion S and the terrace T.

A battery pack according to the present disclosure includes the circuit board 100 for a secondary battery as described above. For example, as shown in FIG. 6, the battery pack according to the present disclosure may include the pouch-type secondary battery 10 and the circuit board 100 described above. In addition, the battery pack according to the present disclosure may include the protection circuit module 160 in a state of being mounted to the circuit board 100 or separate from the circuit board 100.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

REFERENCE SYMBOLS

10: secondary battery
11: electrode tab
100: circuit board
110: tab coupling portion
120: charging/discharging path
130: conductive plate
140: current interruption module
150: external connection terminal
160: protection circuit module

What is claimed is:

1. A circuit board for a secondary battery, which is connected to at least one of a cathode tab and an anode tab of the secondary battery, the circuit board comprising:
    a tab coupling portion connected to the cathode tab or the anode tab;
    a charging/discharging path connected to the tab coupling portion to give a path through which a charging current or a discharging current of the secondary battery flows, the charging/discharging path having at least one path cutting portion formed therein;
    one pair of conductive plates respectively attached to both ends of the path cutting portion, the conductive plates being at least partially bent; and
    a current interruption module having both ends respectively connected to the one pair of conductive plates, the current interruption module sensing a temperature of the secondary battery and interrupting a current according to the sensed temperature.

2. The circuit board for a secondary battery according to claim 1, further comprising:
    a protection circuit module provided on the charging/discharging path to control charging or discharging of the secondary battery.

3. The circuit board for a secondary battery according to claim 1, further comprising:
    a protection circuit module connected to an external connection terminal to control charging or discharging of the secondary battery.

4. The circuit board for a secondary battery according to claim 1,
    wherein the conductive plate has an adjustable bending angle.

5. The circuit board for a secondary battery according to claim 1,
    wherein the conductive plate is perpendicularly bent.

6. The circuit board for a secondary battery according to claim 1,
wherein the conductive plate is bent in a state of protruding toward a location where the secondary battery is positioned.

7. The circuit board for a secondary battery according to claim 1,
wherein the conductive plate is bent on at least two portions.

8. The circuit board for a secondary battery according to claim 1,
wherein the conductive plate is bent so that at least a part of the current interruption module contacts the secondary battery.

9. The circuit board for a secondary battery according to claim 1,
wherein the conductive plate is made of a metal material.

10. The circuit board for a secondary battery according to claim 1,
wherein the current interruption module interrupts a current when the temperature of the secondary battery rises over a reference temperature.

11. The circuit board for a secondary battery according to claim 1,
wherein the current interruption module is a temperature cut-off (TCO) or a positive temperature coefficient (PTC).

12. The circuit board for a secondary battery according to claim 1,
wherein the tab coupling portion comes into contact with the cathode tab or the anode tab by means of welding.

13. The circuit board for a secondary battery according to claim 1,
wherein the tab coupling portion is provided in plural to be coupled to a plurality of cathode tabs or a plurality of anode tabs.

14. The circuit board for a secondary battery according to claim 1,
wherein the secondary battery is a pouch-type secondary battery.

15. A battery pack, comprising a circuit board for a secondary battery as defined in claim 1.

16. A circuit board for a secondary battery, comprising:
a substrate having a top surface and a bottom surface;
a first tab coupling portion and second tab coupling portion;
an external connection terminal having a first contact and a second contact;
a first conductive path connected between the first tab coupling portion and the first contact of the external connection terminal;
a second conductive path connected between the second tab coupling portion and the second contact of the external connection terminal, the second conductive path comprising:
a first section having a first end connected to the second tab coupling portion;
a first conductive plate attached to a second end of the first section;
a second section having a first end connected to the second contact;
a second conductive plate attached to a second end of the second section; and
a current interruption module having ends respectively connected to the first conductive plate and second conductive plate, the current interruption module interrupting a current.

17. The circuit board of claim 16, further comprising a protection circuit module connected to the second section of the second conductive path.

18. The circuit board of claim 16, wherein the first tab coupling portion, second tab coupling portion, the external connection terminal, the first conductive path and the second conductive path are formed on the top surface of the substrate.

19. The circuit board of claim 16, wherein the first conductive plate and the second conductive plate each comprise a first section connected to the top surface of the substrate and a second section extending upwardly from the top surface of the substrate.

* * * * *